United States Patent
Chen et al.

(10) Patent No.: US 12,550,765 B2
(45) Date of Patent: Feb. 10, 2026

(54) PACKAGE SUBSTRATE AND FABRICATING METHOD THEREOF

(71) Applicant: AaltoSemi Inc., Jiangsu (CN)

(72) Inventors: Min-Yao Chen, Jiangsu (CN); Yin-Ju Chen, Jiangsu (CN); Andrew C. Chang, Jiangsu (CN)

(73) Assignee: AaltoSemi Inc., Jiangsu (CN)

( * ) Notice: Subject to any disclaimer, the term of this patent is extended or adjusted under 35 U.S.C. 154(b) by 30 days.

(21) Appl. No.: 18/886,521

(22) Filed: Sep. 16, 2024

(65) Prior Publication Data

US 2025/0096104 A1    Mar. 20, 2025

(30) Foreign Application Priority Data

Sep. 19, 2023   (CN) .......................... 202311212005.6

(51) Int. Cl.
*H01L 21/48* (2006.01)
*H01L 23/498* (2006.01)

(52) U.S. Cl.
CPC .... *H01L 23/49838* (2013.01); *H01L 21/4846* (2013.01); *H01L 23/49827* (2013.01)

(58) Field of Classification Search
CPC ........... H01L 21/4846; H01L 23/49827; H01L 21/4857; H01L 21/486
See application file for complete search history.

(56) References Cited

U.S. PATENT DOCUMENTS

| | | | |
|---|---|---|---|
| 9,837,347 B2 * | 12/2017 | Hu | H01L 23/49866 |
| 2005/0167830 A1 * | 8/2005 | Chang | H05K 3/4007 |
| | | | 257/737 |
| 2013/0072012 A1 * | 3/2013 | Tseng | H05K 3/381 |
| | | | 257/E21.508 |

FOREIGN PATENT DOCUMENTS

| | | |
|---|---|---|
| CN | 116504743 A | 7/2023 |
| TW | 200934322 A | 8/2009 |
| TW | I794034 B | 2/2023 |

OTHER PUBLICATIONS

Chinese Office Action dated Nov. 27, 2024 issued for Chinese patent application No. 202311212005.6 and its English translation.
Taiwanese Office Action dated Mar. 19, 2025 issued for Taiwanese patent application No. 112138987 and and its English translation.

* cited by examiner

*Primary Examiner* — Sherman Ng
(74) *Attorney, Agent, or Firm* — RANKIN, HILL & CLARK LLP

(57) ABSTRACT

A package substrate is provided, in which conductive pillars are formed on a circuit layer of a core board body, and an insulating layer encapsulates the conductive pillars in such a manner that the conductive pillars are exposed from a surface of the insulating layer for use as external contacts. Hence, there is no need to fabricate a wiring layer on the insulating layer. Consequently, a thickness of the package substrate is smaller to meet the requirements of thinning.

5 Claims, 4 Drawing Sheets

PACKAGE SUBSTRATE AND FABRICATING METHOD THEREOF

BACKGROUND

1. Technical Field

The present disclosure relates to a package substrate for carrying chips, and more particularly, to a package substrate with conductive pillars and a fabricating method thereof.

2. Description of Related Art

Technologies currently used in the field of chip packaging include, for example, a chip scale package (CSP), a direct chip attachment (DCA), a multi-chip module (MCM) and other types of package modules. As the functional requirements of end products increase, semiconductor chips need to have more input/output (I/O) contacts, such that the number of external pads on the package substrate used to carry the semiconductor chips also increases accordingly.

FIG. 1A to FIG. 1C are schematic cross-sectional views showing a fabricating method of a conventional package substrate 1.

As shown in FIG. 1A, a core board body 10 is provided with a first side 10a and a second side 10b opposing the first side 10a, and a plurality of conductive vias 100 are formed in the core board body 10 to communicate with the first side 10a and the second side 10b. In addition, circuit layers 101, 102 are formed on the first side 10a and the second side 10b of the core board body 10, respectively, and the conductive vias 100 are electrically connected to the circuit layers 101, 102, wherein the plurality of conductive vias 100 are in the shape of hollow metal pillars, and the hollows can be filled with a plugging material 100a.

As shown in FIG. 1B, an insulating layer 111 having a metal layer 120 is pressed or laminated on the first side 10a and the second side 10b of the core board body 10, such that the circuit layers 101, 102 are embedded in the insulating layer 111. Subsequently, a plurality of openings 1110 are formed on each of the insulating layers 111 by laser or other methods, such that portions of the surfaces of the circuit layers 101, 102 are exposed from the openings 1110.

As shown in FIG. 1C, a copper electroplating process is performed to the metal layer 120 so as to form a wiring layer 13 having a plurality of external pads 130 on each of the insulating layers 111, and a plurality of conductive blind vias 11 are formed in the openings 1110 to electrically connect the circuit layers 101, 102 to the wiring layer 13. After that, the exposed metal layer 120 is removed, and only a metal layer 12 under the wiring layer 13 is retained.

However, in the conventional package substrate 1, the external pad 130 serves as an external contact, and thus the wiring layer 13 needs to be made on the insulating layer 111. Therefore, the insulating layer 111 needs to have a certain thickness, and the thickness of the wiring layer 13 needs to be taken into account, such that the thickness of the conventional package substrate 1 is difficult to be thinned.

Moreover, the external pad 130, as an external contact, is wider than the conductive blind via 11, and thus needs to be a certain size for the circuit specification. As a result, the wiring density of the package substrate 1 is limited, and thus it is difficult for the package substrate 1 to meet the demand for fine line width/fine line pitch.

In addition, using laser drilling method to form the plurality of openings 1110 requires the use of expensive laser machine equipment, which makes it difficult to reduce the fabricating cost of the conventional package substrate 1.

Therefore, how to overcome the various problems of the above-mentioned prior art fabricating methods has become an urgent issue to be solved.

SUMMARY

In view of the various shortcomings of the prior art, the present disclosure provides a package substrate, which comprises: a core board body having a first side and a second side opposing the first side, wherein the core board body has a plurality of conductive vias communicating with the first side and the second side, and a circuit layer electrically connecting the plurality of conductive vias is formed on the first side and the second side of the core board body; a plurality of conductive pillars disposed on the circuit layer on the first side and the second side of the core board body and electrically connected to the circuit layer, wherein a seeding layer is formed around a periphery of and at a bottom of each of the plurality of conductive pillars; and an insulating layer formed on the first side and the second side of the core board body and encapsulating the plurality of conductive pillars, wherein the plurality of conductive pillars are exposed from a surface of the insulating layer.

The present disclosure further provides a method of fabricating a package substrate, and the method comprises: providing a core board body having a first side and a second side opposing the first side, wherein the core board body has a plurality of conductive vias communicating with the first side and the second side, and a circuit layer electrically connecting the plurality of conductive vias is formed on the first side and the second side of the core board body; forming a plurality of conductive pillars on the circuit layer on the first side and the second side of the core board body, and electrically connecting the plurality of conductive pillars to the circuit layer, wherein a seeding layer is formed around a periphery of and at a bottom of each of the plurality of conductive pillars; and forming an insulating layer on the first side and the second side of the core board body to encapsulate the plurality of conductive pillars, wherein the plurality of conductive pillars are exposed from a surface of the insulating layer.

In the aforementioned package substrate and method, a seeding layer is formed around a periphery of and at a bottom of each of the plurality of conductive pillars, such that a top of each of the plurality of conductive pillars or a surface not covered by the seeding layer is exposed from the surface of the insulating layer.

In the aforementioned package substrate and method, the seeding layer is a conductive film.

In the aforementioned package substrate and method, the seeding layer is a metal layer.

In the aforementioned package substrate and method, a surface of each of the plurality of conductive pillars is flush with or lower than the surface of the insulating layer.

In an aspect, the package substrate is fabricated by first forming an insulating layer on the first side and the second side of the core board body; forming openings on the insulating layer; forming a metal layer on the insulating layer and in the openings; removing the material of the metal layer on the insulating layer and retaining the material of the metal layer in the openings for use as a plurality of conductive pillars, such that the plurality of conductive pillars are electrically connected to the circuit layer and exposed from the surface of the insulating layer.

As can be seen from the above, in the package substrate and the fabricating method thereof of the present disclosure, the conductive pillars are used as external contacts to replace the conventional external pads, such that there is no need to make a conventional wiring layer on the insulating layer. As such, compared to the prior art, the thickness of the package substrate of the present disclosure is relatively low, so as to meet the needs of thinning.

Furthermore, by utilizing the conductive pillars as external contacts, the circuit with specification of fine line width/fine line pitch is smaller, so the package substrate of the present disclosure has a higher density of wiring compared to the conventional wiring layer.

DETAILED DESCRIPTION

The following describes the implementation of the present disclosure with examples. Those skilled in the art can easily understand other advantages and effects of the present disclosure from the content disclosed in this specification.

It should be understood that, the structures, ratios, sizes, and the like in the accompanying figures are used for illustrative purposes to facilitate the perusal and comprehension of the content disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical content disclosed in the present specification. Meanwhile, terms such as "on," "upper," "a," "one" and the like are merely for clear explanation rather than limiting the practicable scope of the present disclosure, and thus, alterations or adjustments of the relative relationships thereof without essentially altering the technical content should still be considered in the practicable scope of the present disclosure.

FIG. 2A to FIG. 2E are schematic cross-sectional views showing a method of fabricating a package substrate 2 according to a first embodiment of the present disclosure.

Figure 1A:
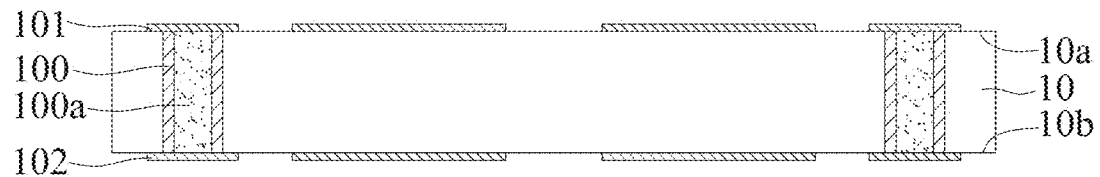
FIG. 1A to FIG. 1C are schematic cross-sectional views showing a fabricating method of a conventional package substrate.
Figure 1B:
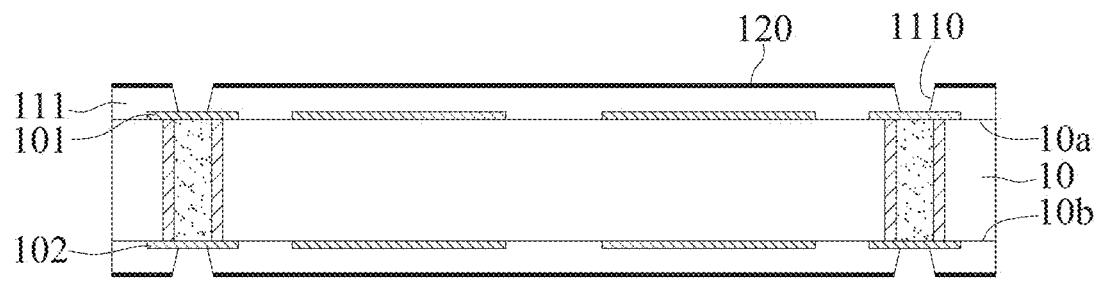
Figure 1C:
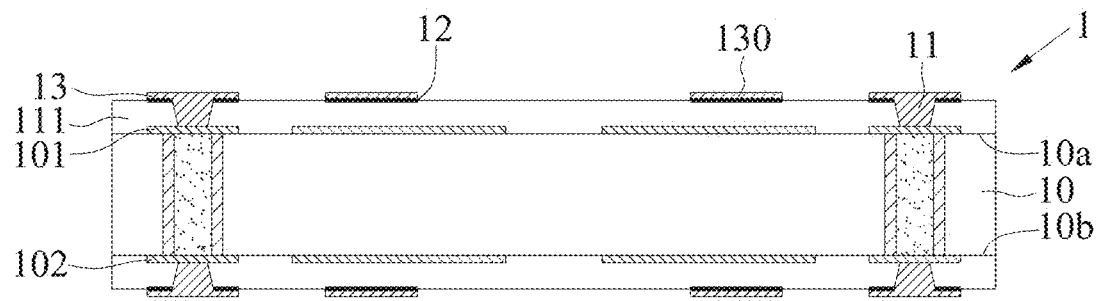
Figure 2A:
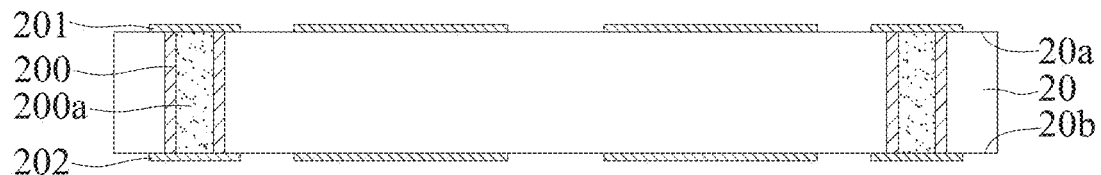
FIG. 2A to FIG. 2E are schematic cross-sectional views showing a method of fabricating a package substrate according to a first embodiment of the present disclosure.

As shown in FIG. 2A, a core board body 20 is provided with a first side 20a and a second side 20b opposing the first side 20a, and circuit layers 201, 202 are formed on the first side 20a and the second side 20b of the core board body 20, respectively. In addition, the core board body 20 has a plurality of conductive vias 200 communicating with the first side 20a and the second side 20b, such that the plurality of conductive vias 200 are electrically connected to the circuit layers 201, 202.

In an embodiment, the core board body 20 may be an organic polymeric board including a bismaleimide triazine (BT) or a glass-fiber prepreg (PP) or other boards, and the plurality of conductive vias 200 are in the shape of hollow pillars, and the hollows may be filled with a plugging material 200a, wherein the plugging material 200a is of various types, such as conductive adhesive, ink, etc., and is not particularly limited. It should be understood that in other embodiments, the plurality of conductive vias 200 may also be solid metal pillars without being filled with the plugging material 200a.

Figure 2B:
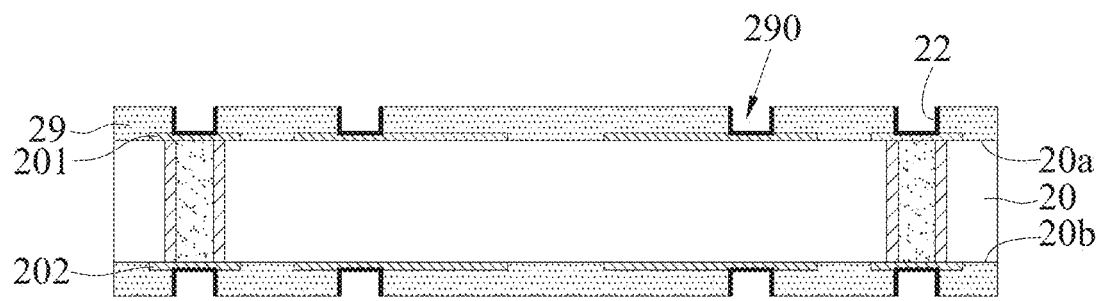

As shown in FIG. 2B, a barrier layer 29 is formed on the first side 20a and the second side 20b of the core board body 20, and a plurality of patterned openings 290 are formed on each of the barrier layers 29, such that the circuit layers 201, 202 are exposed from the patterned openings 290. Subsequently, a seeding layer 22 is formed on the walls of the barrier layer 29 and the patterned openings 290. Afterwards, the material of the seeding layer 22 on the barrier layer 29 is removed, and only the material of the seeding layer 22 on the walls of the patterned openings 290 is retained.

In an embodiment, the barrier layer 29 is a photosensitive dry film and is used to form the patterned openings 290 by exposure and development, whether in Liquid or Film type.

Moreover, the seeding layer 22 is a conductive film made of such as graphene or a metal layer made of such as copper. For example, a copper layer is formed by sputtering to serve as the seeding layer 22; alternatively, a graphene film is bonded by pressing/laminating to serve as the seeding layer 22.

Figure 2C:
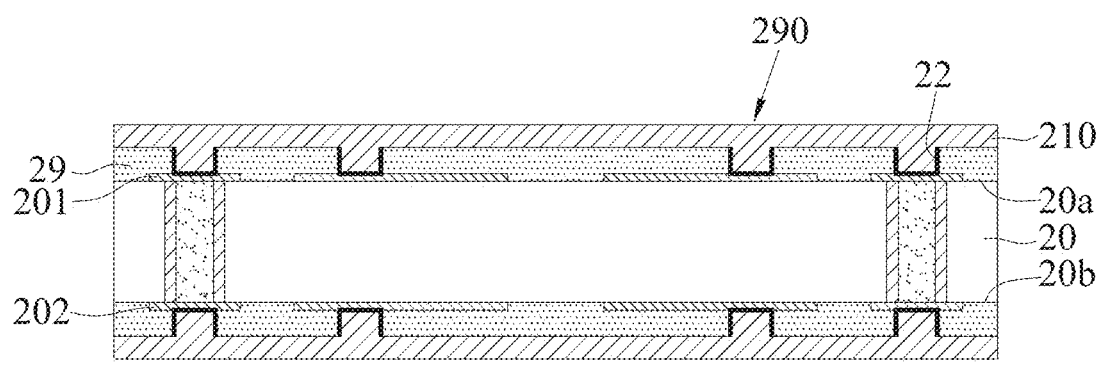

As shown in FIG. 2C, a metal layer 210 made of such as copper is formed on the barrier layer 29 and the seeding layer 22.

Figure 2D:
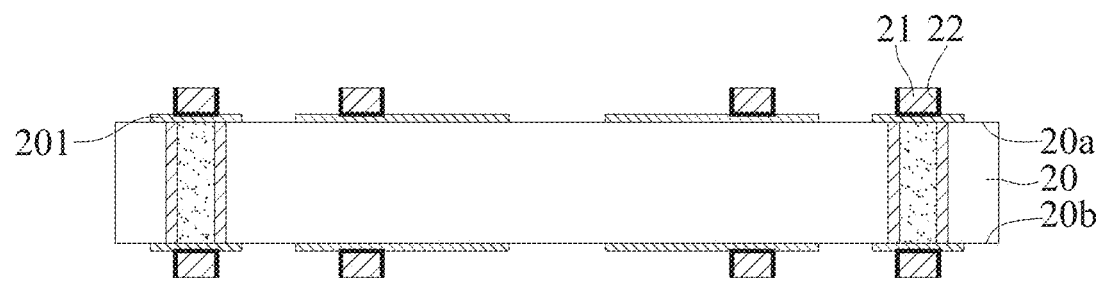

As shown in FIG. 2D, the material of the metal layer 210 on the barrier layer 29 is removed, and only the material of the metal layer 210 in the patterned openings 290 is retained for use as a plurality of conductive pillars 21, such as copper pillars, such that the conductive pillars 21 are electrically connected to the circuit layers 201, 202 and are surrounded by seeding layer 22. Subsequently, the barrier layer 29 is removed to expose the first side 20a and the second side 20b of the core board body 20.

Figure 2E:
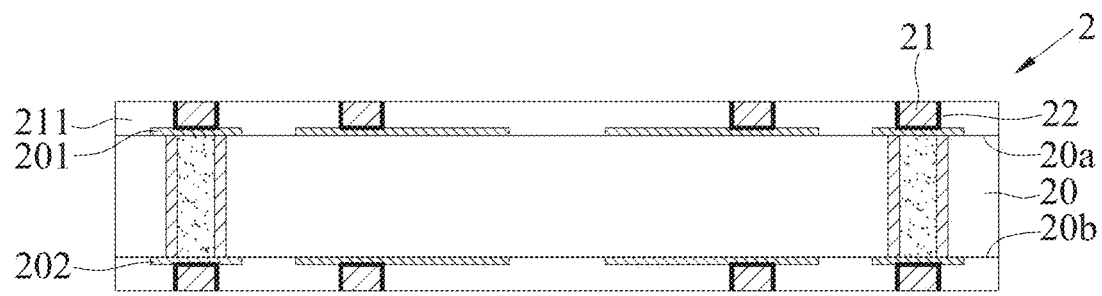

As shown in FIG. 2E, an insulating layer 211 is formed on the first side 20a and the second side 20b of the core board body 20, such that the circuit layers 201, 202 and the conductive pillars 21 are embedded in the insulating layer 211, wherein the surface of each of the insulating layers 211 is flush with the surface of each of the conductive pillars 21, such that the conductive pillars 21 are exposed from the surface of each of the insulating layers 211.

In an embodiment, each of the insulating layers 211 is a dielectric layer, such as an Ajinomoto build-up film (ABF) or made of other dielectric materials.

Moreover, a portion of the material of the insulating layer 211 is removed by plasma, grinding, or other methods, so that the surface of each of the insulating layers 211 is flush with the surface of each of the conductive pillars 21, such that the conductive pillars 21 are exposed from the surface of each of the insulating layers 211.

Further, the fabricating method of the present disclosure does not require a wiring process on the insulating layers 211, such that the conductive pillars 21 are used as external contacts for bonding solder materials.

Therefore, according to the first embodiment of the present disclosure, the fabricating method utilizes a dry film as the barrier layer 29, to facilitate the fabrication of circuit with specification of fine line width/fine line pitch, such as less than or equal to 10 micrometers (μm).

Moreover, by using the dry film as the barrier layer 29, the patterned openings 290 are formed by exposure and development method, instead of the conventional laser drilling method. Therefore, compared to the expensive laser machine equipment, the fabricating method of the present disclosure can save the cost of equipment, which is conducive to the reduction of the fabricating cost of the package substrate 2.

Furthermore, according to the first embodiment of the present disclosure, the fabricating method uses the conductive pillars 21 as external contacts, and thus there is no need to form grooves on the insulating layer 211 for accommodating the wiring layer. Consequently, the fabricating process of the insulating layer 211 can be omitted, and the thickness of the insulating layer 211 can be reduced to facilitate thinning of the package substrate 2.

Figure 3A:
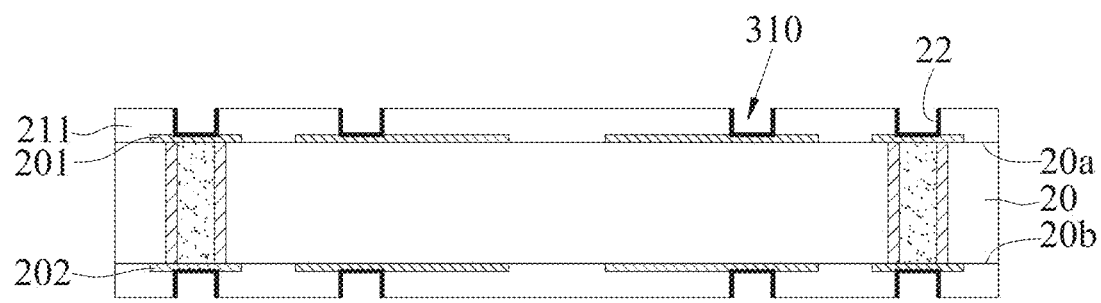
FIG. 3A to FIG. 3C are schematic cross-sectional views showing a method of fabricating a package substrate according to a second embodiment of the present disclosure.
Figure 3B:
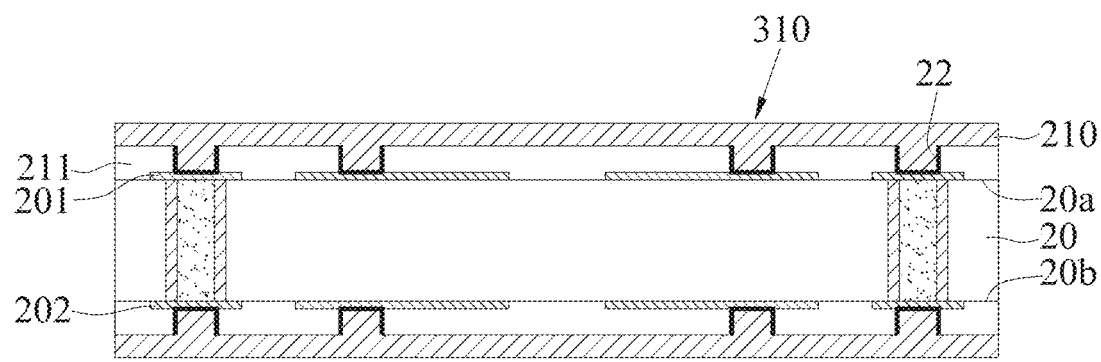
Figure 3C:
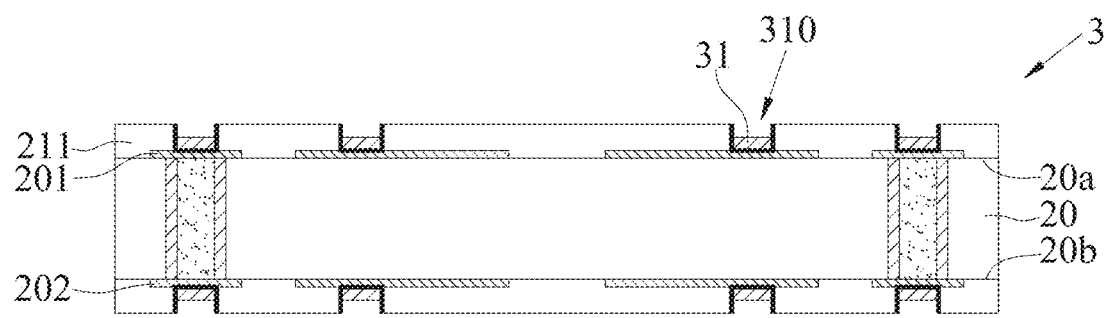

FIG. 3A to FIG. 3C are schematic cross-sectional views showing a method of fabricating a package substrate 3 according to a second embodiment of the present disclosure. The difference between the second embodiment and the first embodiment is in the thickness of conductive pillars 31, and the other processes are more or less the same, so the similarities will not be repeated hereinafter.

As shown in FIG. 3A, continuing the process of FIG. 2A, an insulating layer 211 is formed on the first side 20a and the second side 20b of the core board body 20, and a plurality of openings 310 are formed on each of the insulating layers 211, such that the circuit layers 201, 202 are exposed from the openings 310. Subsequently, a seeding layer 22 is formed on the walls of the openings 310.

In an embodiment, a portion of the material of the insulating layer 211 is removed by plasma etching or other methods to form the openings 310.

As shown in FIG. 3B, a metal layer 210 is formed on the insulating layer 211 and in the openings 310 by electroplating or other methods.

As shown in FIG. 3C, the material of the metal layer 210 on the insulating layer 211 is removed, and only the material of the metal layer 210 in the openings 310 is retained for use as the plurality of conductive pillars 31, such that the conductive pillars 31 are electrically connected to the circuit layers 201, 202, wherein the surface of each of the conductive pillars 31 is lower than the surface of each of the insulating layers 211, such that each of the conductive pillars 31 is exposed from each of the openings 310.

In an embodiment, the material of the metal layer 210 on the insulating layer 211 is removed by etching, so the metal layer 210 at the openings 310 is also micro-etched, such that the surface of each of the conductive pillars 31 is lower than the surface of each of the insulating layers 211.

Accordingly, in the fabricating method of the second embodiment, the openings 310 are first formed on the insulating layer 211 to fabricate the conductive pillars 31, thereby eliminating the need to form the barrier layer 29.

The present disclosure also provides a package substrate 2, 3, which comprises: a core board body 20 having a first side 20a and a second side 20b opposing the first side 20a, a plurality of conductive pillars 21, 31 disposed on the first side 20a and the second side 20b of the core board body 20, and an insulating layer 211 formed on the first side 20a and the second side 20b of the core board body 20 and encapsulating the plurality of conductive pillars 21, 31.

The core board body 20 has a plurality of conductive vias 200 communicating with the first side 20a and the second side 20b, and circuit layers 201, 202 are formed on the first side 20a and the second side 20b of the core board body 20, respectively, and the plurality of conductive vias 200 are electrically connected to the circuit layers 201, 202.

The conductive pillars 21, 31 are disposed on the circuit layers 201, 202 to electrically connect the circuit layers 201, 202, wherein the periphery and the bottom of each of the plurality of conductive pillars 21, 31 are formed with a seeding layer 22, and the plurality of conductive pillars 21, 31 are exposed from the surface of the insulating layer 211.

In an embodiment, the seeding layer 22 is a conductive film made of such as graphene or a metal layer made of such as copper.

In an embodiment, the surface of each of the plurality of conductive pillars 21 is flush with the surface of the insulating layer 211.

In an embodiment, the surface of each of the plurality of conductive pillars 31 is lower than the surface of the insulating layer 211.

In summary, in the package substrate 2, 3 and the fabricating method thereof of the present disclosure, the plurality of conductive pillars 21, 31 are used as external contacts to replace the conventional external pads 130, such that there is no need to fabricate the conventional wiring layer 13 on the insulating layer 211. As such, compared to the prior art, the thickness of the package substrate 2, 3 of the present disclosure is smaller, thereby meeting the requirement of thinning.

Moreover, by utilizing the conductive pillars 21, 31 as external contacts, the circuit with specification of fine line width/fine line pitch is smaller, so the package substrate 2, 3 of the present disclosure has a higher wire density compared to the conventional wiring layer 13.

Furthermore, the seeding layer 22 has better bonding properties, so the periphery and the bottom of each of the plurality of conductive pillars 21, 31 are covered by the seeding layer 22 so as to facilitate the bonding with the insulating layer 211.

In addition, the shape of the plurality of conductive pillars 21, 31 may be designed according to demand, but it is necessary to avoid extending to the periphery of the end surfaces thereof.

The above embodiments are provided for illustrating the principles of the present disclosure and its technical effect, and should not be construed as to limit the present disclosure in any way. The above embodiments can be modified by one of ordinary skill in the art without departing from the spirit and scope of the present disclosure. Therefore, the scope claimed of the present disclosure should be defined by the following claims.

What is claimed is:

1. A method of fabricating a package substrate, comprising:
    providing a core board body having a first side and a second side opposing the first side, wherein the core board body has a plurality of conductive vias communicating with the first side and the second side, and a circuit layer electrically connecting the plurality of conductive vias is formed on the first side and the second side of the core board body;
    forming a barrier layer on the first side and the second side of the core board body;
    removing the barrier layer after forming a plurality of conductive pillars on the circuit layer on the first side and the second side of the core board body by exposure and development by means of the barrier layer, and electrically connecting the plurality of conductive pillars to the circuit layer, wherein a seeding layer is formed around a periphery of and at a bottom of each of the plurality of conductive pillars; and
    forming an insulating layer on the first side and the second side of the core board body to encapsulate the plurality of conductive pillars, wherein the plurality of conductive pillars are exposed from a surface of the insulating layer.

2. The method of claim 1, wherein the seeding layer is a conductive film.

3. The method of claim 1, wherein the seeding layer is a metal layer.

4. The method of claim 1, wherein a surface of each of the plurality of conductive pillars is flush with the surface of the insulating layer.

5. The method of claim 1, wherein a surface of each of the plurality of conductive pillars is lower than the surface of the insulating layer.

* * * * *